United States Patent [19]
Cronin

[11] Patent Number: 5,753,963
[45] Date of Patent: *May 19, 1998

[54] A MULTI-SURFACED CAPACITOR FOR STORING MORE CHARGE PER HORIZONTAL CHIP AREA

[75] Inventor: John Edward Cronin, Milton, Vt.

[73] Assignee: International Busness Machines Corp., Armonk, N.Y.

[*] Notice: The term of this patent shall not extend beyond the expiration date of Pat. No. 5,589,707.

[21] Appl. No.: 653,594

[22] Filed: May 24, 1996

Related U.S. Application Data

[62] Division of Ser. No. 335,012, Nov. 7, 1994, Pat. No. 5,589,707.

[51] Int. Cl.$^6$ .......................... H01L 27/108; H01L 29/00
[52] U.S. Cl. .......................... 257/532; 257/528; 257/534
[58] Field of Search .......................... 257/528, 532, 257/534

[56] References Cited

U.S. PATENT DOCUMENTS

| | | | |
|---|---|---|---|
| 5,097,315 | 3/1992 | Shiga | 257/532 |
| 5,304,506 | 4/1994 | Porter et al. | 437/60 |
| 5,349,494 | 9/1994 | Ando | 257/532 |
| 5,589,707 | 12/1996 | Cronin | 257/532 |

FOREIGN PATENT DOCUMENTS

| | | | |
|---|---|---|---|
| 5335483 | 12/1993 | Japan | 257/532 |

Primary Examiner—Valencia Martin Wallace
Attorney, Agent, or Firm—Thornton & Thornton

[57] ABSTRACT

An integrated circuit capacitor device that increases capacitance without proportionately using more substrate surface area. Uniquely, the capacitor uses up to all four sides of the first charge plate to store charge by surrounding it with a second charge plate with an insulator layer separating the two plates.

6 Claims, 2 Drawing Sheets

A MULTI-SURFACED CAPACITOR FOR STORING MORE CHARGE PER HORIZONTAL CHIP AREA

This is a divisional of application Ser. No. 08/335,012 filed on Nov. 7, 1994, U.S. Pat. No. 5,589,707.

FIELD OF THE INVENTION

The present invention relates to an integrated circuit (IC) design and method for a capacitor that increases capacitance without proportionately using more substrate surface area. Uniquely, the capacitor has a second charge plate that is next to a first charge plate along the bottom and at least one side or top portion of the first charge plate.

BACKGROUND OF THE INVENTION

It is well documented that when integrated circuits (ICs) are operating they create electronic noise that is disruptive to proper operation if the noise is not controlled. Decoupling capacitors can be used to filter out much of this noise. An example of a typical decoupling capacitor 5 is illustrated in FIG. 1. Silicon substrate 10 forms one of two typical capacitor plates. The substrate is doped with impurities to form a p-type substrate. Thick field oxide 11 is formed to surround areas where the decoupling capacitor is to be placed. A layer of thin oxide 12, also called an insulator layer, is formed to blanket the surface of the entire silicon substrate 10. Next, a layer of conducive material is deposited. Typically used conductive materials are doped polysilicon or a silicide (such as tungsten silicide). These two layers are then patterned and etched to create and define a second decoupling capacitor conductive plate 14 separated the first plate (substrate 10) by insulator layer 12. Conductive plate 14, oxide layer 12, and the underlying p-type substrate 10 form a typical simple decoupling capacitor. Typically, the decoupling capacitor is covered with a finishing or capping layer 19, which can be made from silicon dioxide.

Decoupling capacitors are designed to maximize the amount of stored charge (or capacitance) per unit area to resist large instantaneous voltage swings. When multiple transistors are switched on and off at any single time, their combined resulting current draw can get very large. This large current draw causes a proportionately large supply voltage drop to the chip. After this drop, it takes time for the supply voltage to reestablish the required supply voltage level needed for regular chip operation. Supply voltage variations can result in logic signal errors and significant physical damage to the chip. To prevent large supply voltage variations, decoupling capacitors are used to store surplus charge on the chip. Therefore, when there is a large draw of current, the surplus charge is used to keep the supply voltage within acceptable limits.

Therefore, one goal for circuit designers is to increase the amount of decoupling capacitance available on a chip. It is known that capacitance is calculated by the equation: C=EA/d; where E is the permitivity of the insulator separating the two capacitor plates 14 and 10; A is the surface area of plate 14 available to store charge; and d is the distance between the two plates 14 and 10. Given the capacitance equation, circuit designers can increase capacitance on a chip by either decreasing the distance between the capacitor plates, or increasing the permitivity and the available area for storing charge. However, the circuit designers have to work within both physical and process limitations when adjusting the capacitance equation variables. Current process techniques have already reached the limits of decreasing the distance between capacitor plates and increasing permitivity thresholds. Therefore, without new processes or materials, the only remaining option for designers is to increase the available area for storing charge.

One standard method to increase capacitance storage area is to increase the size of the particular capacitor plates. This is routinely done by calculating the length times the width of the capacitor's bottom surface area, which is the area available for storing charge. Another standard method, very similar to the first, is to add more capacitors of the same size.

Technological advances, meanwhile, have made it possible to design chips with smaller and more electronic devices, like transistors, to be placed on the same size chip. However, every time more devices are placed on the same size chip, a proportional increase in unwanted electronic noise occurs, requiring a proportional increase in the area needed for placing decoupling capacitors on the chip. As electronic devices are being placed onto the same size chip, a larger area is needed for decoupling capacitors to control the additional noise. These two demands are incompatible given the current state of the technology.

Therefore, circuit designers want a way to design complex circuits without increasing the amount of chip substrate surface area needed for storing more capacitance. Put in another way, circuit designers want a decoupling capacitor design that provides for more capacitance without decreasing circuit design area.

The above described problems with capacitors, and decoupling capacitors in particular, and other problems, are solved through the subject invention and will become more apparent, to one skilled in the art, from the figures, detailed description of the subject invention, and appended claims.

SUMMARY OF THE INVENTION

The capacitor structure of the present invention has a first capacitor plate, located above the chip substrate. The first capacitor plate has a length longer than the width and height. The capacitor further has a second capacitor plate that creates a capacitance extending along the full length of both the bottom surface and a side surface of the first plate.

The second capacitor plate is designed to include the substrate, and a metal layer. The metal layer has a first portion in contact with the substrate, and a second portion overlaying the first capacitor plate (with an insulator structure therebetween) to provide a capacitor structure.

The capacitor also has an insulating layer, positioned between the first capacitor plate and the second capacitor plate.

A further embodiment of the invention is to further increase the total capacitance of a single capacitor by providing an irregular surface on the top side of the first capacitor plate to increase the overall surface area available for storing charge.

Figure 1:
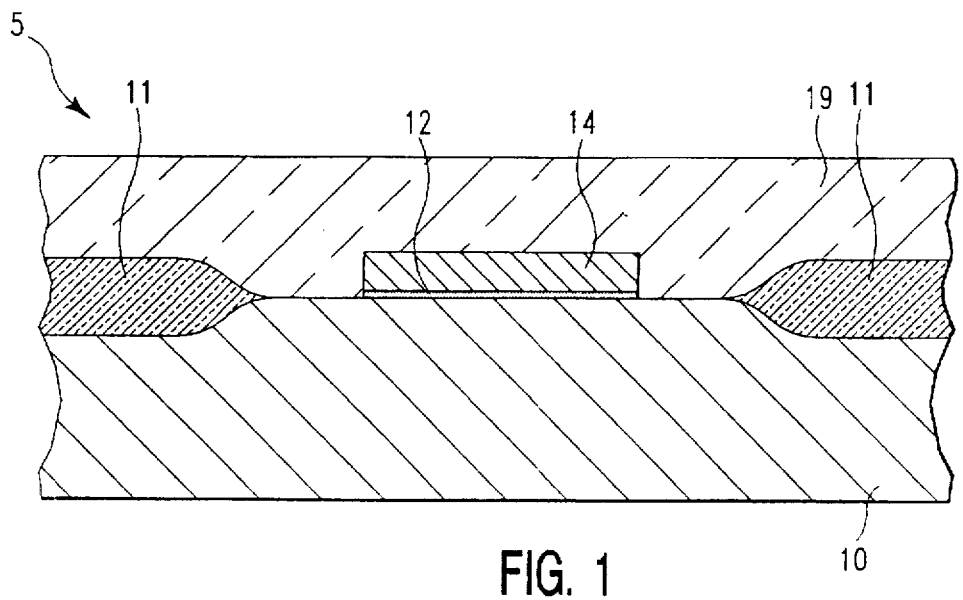
FIG. 1 (Prior Art) is a cross sectional view of a prior art decoupling capacitor.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. Additionally, like numbering in the drawings represent like elements within and between drawings.

Incorporation by Reference

The following listed patents are herein incorporated by reference for pertinent and supporting information:

U.S. Pat. No. 5,307,309, is a memory module having on-chip surge capacitors.

U.S. Pat. No. 5,304,506, is an on-chip decoupling capacitor.

U.S. Pat. No. 5,306,655, is a structure and method of manufacture for MOS field effect transistor having lightly doped drain and source diffusion regions.

U.S. Pat. No. 5,296,401, is a MIS device having P channel MOS device and N channel MOS device with LDD structure and manufacturing method thereof.

U.S. Pat. No. 5,266,821, is a chip decoupling capacitor.

U.S. Pat. No. 5,043,781, is a semiconductor device.

U.S. Pat. No. 4,080,590, is a capacitor storage memory.

U.S. Pat. No. 4,776,087, is a VLSI coaxial wiring structure.

DETAILED DESCRIPTION OF THE INVENTION

Figure 2:
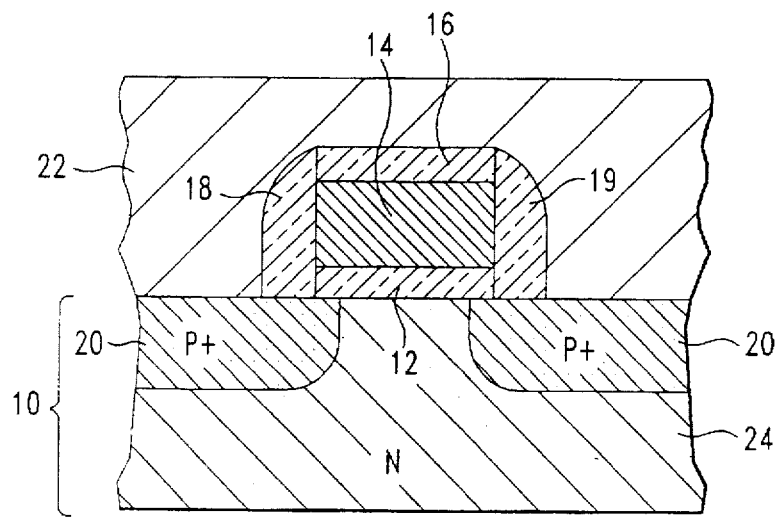
FIG. 2 is a cross sectional view of a first embodiment of the invention.

FIG. 2 is a cross sectional view of the general invention, having the following additional structural elements over FIG. 1: Above substrate 10, are two side wall insulators 18 and 19; an insulative capping layer, or cap, 16; and a metal layer 22. Substrate 10 has two highly doped regions 20 (P+), and a relatively less doped region 24 (N) located between and below the highly doped regions. The metal layer 22 contacts an internal power supply input and the substrate 10 through doped regions 20. As will become more clear with reference to FIG. 3, the plate 14 is coupled to an input/output signal source (eg. a 5 volt power supply) to provide the decoupling capacitance.

Unlike prior art capacitors, the second capacitor plate is made up of both a metal layer 22 overlaying the top and sides of plate 14, and substrate 10 that is located below first plate 14 and contacts the metal layer via diffusion regions 20. Also, unlike the prior art capacitors, the insulative layer is a composite of the insulator base layer 12, the sidewall insulators 18 and 19, and the insulator cap 16. Thus, plate-to-plate dielectric is provided solely by discrete layers. The layers have a thickness and composition that can be varied to maximize different capacitor characteristics like permitivity. For example, the insulator layers are 500 angstroms thick, and a material permitivity range of four to seven.

An advantage of this decoupling capacitor design is that standard field effect transistor (FET) fabrication processes can be used to make all of the above structural features of this capacitor. For references describing suitable standard IC manufacturing techniques, see the *Basic Integrated Circuit Technology Reference Manual*, Integrated Circuit Engineering Corporation, or ICE, 1993, and the above patents incorporated by reference.

Figure 3:
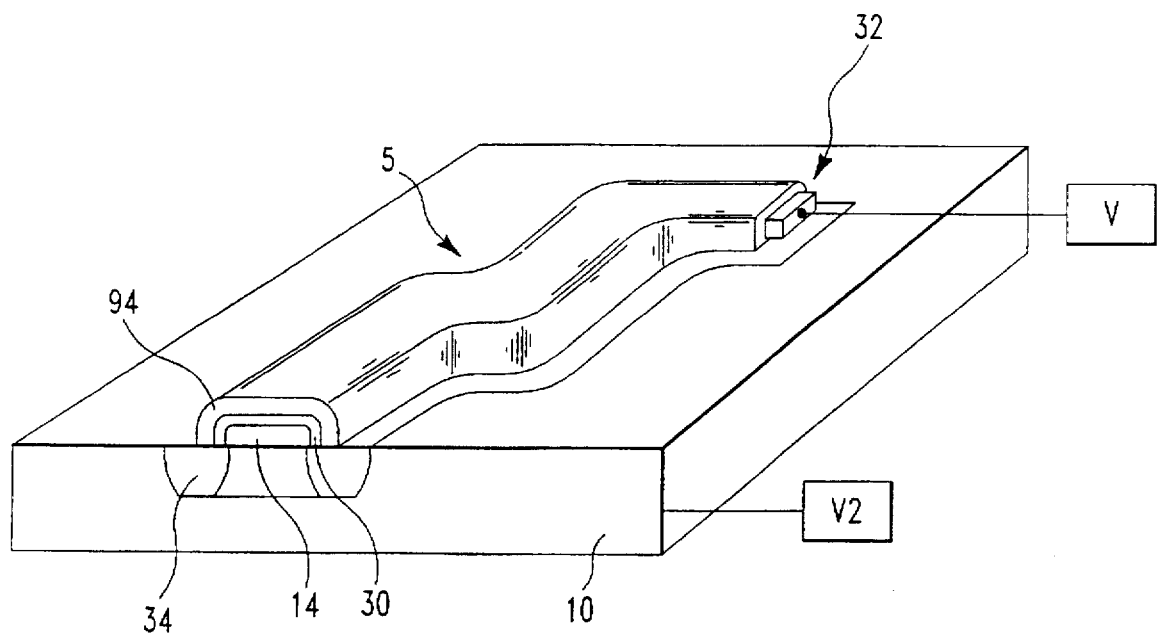
FIG. 3 is a perspective view of the first embodiment of the invention.

FIG. 3 is a perspective view of the first embodiment of the invention.

There is illustrated first plate 14, composite second capacitor plate 22 and 34, and composite insulator structure 30, all longitudinally extended over the surface of substrate 10. Also illustrated is a first end 32, designed with some of plate 14 exposed (i.e., extending beyond insulator layer 30 and metal layer 22) to contact a first power supply (V1). A single P+ well 34, in substrate 10 beneath the first plate, provides a single contact to metal layer 22 that serves as a functional equivalent of the two regions 20 and region 24 previously illustrated. A second power supply, generally represented by V2, is coupled to the second capacitor plate in any number of known methods; for example, coupled directly to the substrate, or coupled to well 34 via a separate metal line.

Capacitor 5 is designed with the overall goal of maximizing the capacitance of the capacitor. Thus, insulator composite structure 30 is formed to have a thickness approaching the known limits of capacitor breakdown, which is around 70 angstroms for silicon dioxide. Prior art designers were only concerned with having a thin insulator layer between plate 14 and substrate 10 to increase the charge storage in a capacitor.

A variation of the invention is to have different materials or different doping of materials used to form the insulation layer. Specifically, the insulation layer can be made of a first material for the side wall insulation, a second material for the cap, and a third material for the bottom. By varying the material in such a fashion, a designer could vary certain capacitor characteristics, like permitivity. Prior art designers were never concerned with the permitivity of the insulator material around these additional surfaces of the capacitor plate for creating more capacitance.

Figure 4:
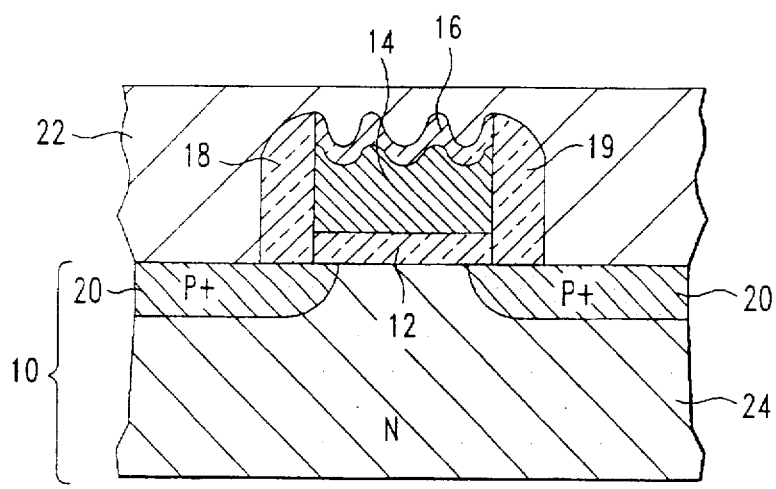
FIG. 4 is a cross sectional view of a second embodiment of the invention.

FIG. 4 presents a cross sectional view of another variation of the invention. Both the insulator cap 16 and the top surface of plate 14 are nonplaner. The nonplaner design increases the total surface area to further increase the total capacitance of the capacitor. This nonplaner or rough surface can be achieved by several known methods. One method in particular, involves the use of micro-masks. A process of making and using micro masks is described in U.S. Pat. No. 5,254,503, assigned to International Business Machines Corporation, which is herein incorporated by reference. This patent teaches of a method to enable the formation of sub-lithographic relief images to increase the surface area of semiconductor structures for use in the storage nodes of DRAM cells. The method includes the steps of forming in situ a nonplanar region having a relief pattern comprising sub-micron sized elements, and the transferring of the relief pattern into a masking layer to selectively etch a substrate to form deep trenches having a density equal to the relief pattern. Polysilicon amorphous silicon can be used to form the sub-micron relief pattern.

Figure 5:
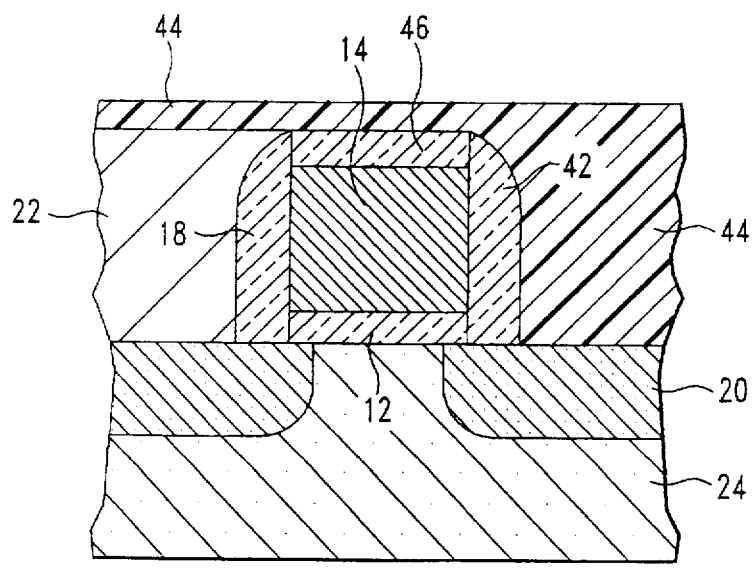
FIG. 5 is a cross sectional view of a third embodiment of the invention.

FIG. 5 is a cross sectional view of a third embodiment of the invention. In this embodiment, not all of the sides of the capacitor plate 14 are used to store charge. For example, layer 44 is an insulative material. Many invention variations are obtained by covering differing portions of the first plate 14 with metal layer 22.

It is noted that the invention is generally discussed in terms of a decoupling capacitor; where in fact, any capacitor may be designed using this disclosure of the invention. Uniquely, the invention effectively increases capacitor storage area without requiring the prior art increase of chip substrate surface area usage. This is achieved by establishing a ground capacitor plate that includes the substrate, a metal line overlaying part of the first capacitor plate through thin dielectric, and a diffusion region contacting both the metal line and substrate. A feature of the invention is that thin sidewall spacers and insulator caps can be used to provide the interlayer dielectric, to maximize capacitor characteristics while minimizing substrate surface area usage. In the spirit of the general embodiment of the invention, any shape can be used for the inner plate of the capacitor e.g., round versus square.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. It will also be understood that the invention is not limited to the particular embodiment described herein, but is capable of many rearrangements, modifications, and substitutions without departing from the scope of the invention. The scope of the invention is, therefore, indicated by the appended claims rather than by this description.

What is claimed is:

1. A semiconductor chip comprising:
   a semiconductor substrate, first and second regions of a first conductivity type deposed therein, said regions being separated by a third region of a second conductivity type;
   a first elongated dielectric layer disposed on a portion of a surface of said substrate overlying a portion of said third region;
   a first, conductive, elongated capacitor plate, having a top surface, a selected width and further having a pair of sidewalls of a selected height, located over said first dielectric layer on said substrate and separated from said third region in said substrate by said first dielectric layer,
   a second dielectric layer deposed along substantially the full length of a first one of said pair of sidewalls;
   a third dielectric layer deposed along substantially the full length of the other one of said pair of sidewalls;
   a fourth dielectric layer disposed over substantially the full length of said top surface; and
   a second capacitor conductive plate extending along substantially the full length of one of the dielectric layers on one of said sidewalls and in electrical contact with said first region in said substrate.

2. The capacitor of claim 1, wherein at least one of said dielectric layers has a first permitivity and at least one of the other dielectric layers has a different permitivity.

3. The capacitor of claim 1, wherein said first plate is coupled to an external power supply input, and said second plate is coupled to an internal power supply.

4. The capacitor of claim 1, wherein one of the dielectric layers is formed of a first material and one of the other dielectric layers is formed of a second and different material.

5. An integrated circuit comprising:
   a semiconductor substrate having a surface with a first region of a first conductivity type and a second region of a second conductivity type deposed therein; and
   a capacitor disposed on said surface of said substrate comprising:
   a dielectric body disposed on the portion of the semiconductor substrate overlying said first region;
   a first elongated, conductive body disposed within said dielectric body and being substantially surrounded by said dielectric body.
   a second, elongated conductive body disposed against and in conformal contact with said dielectric body and extending substantially the full length of the dielectric body substantially parallel to said first elongated conductive body and in conductive contact with said second region in said substrate.

6. A capacitor comprising:
   a semiconductor substrate having a surface with a first region of a first conductivity type and a second region of a second conductivity type disposed therein;
   a first dielectric layer having an established area disposed on a portion of a surface of said substrate overlying said first region;
   a first conductor having an area substantially equal to the area of the first dielectric area and further having a top surface and a pair of sidewalls, located over said first dielectric layer and electrically separated from said first region in said substrate by said first dielectric layer,
   a second dielectric layer disposed along the first one of said pair of sidewalls;
   a third dielectric layer disposed along the other one of said pair of sidewalls;
   a fourth dielectric layer disposed over said top surface; and
   a second capacitor plate extending over a portion of said fourth dielectric layer disposed on said top surface and one of the dielectric layers on one of said sidewalls,
   said second capacitive plate being in electrical contact with said second region in said substrate.

* * * * *